United States Patent
McFarland (10) Patent No.: US 8,427,186 B2
(45) Date of Patent: Apr. 23, 2013

(54) PROBE ELEMENT HAVING A SUBSTANTIALLY ZERO STIFFNESS AND APPLICATIONS THEREOF

(75) Inventor: Andrew W. McFarland, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 460 days.

(21) Appl. No.: 12/686,196

(22) Filed: Jan. 12, 2010

(65) Prior Publication Data
US 2011/0169516 A1   Jul. 14, 2011

(51) Int. Cl.
*G01R 1/067* (2006.01)

(52) U.S. Cl.
USPC ............ 324/755.05; 324/755.04; 324/754.11; 324/754.03; 324/755.09

(58) Field of Classification Search ............ 324/755.04, 324/755.02, 755.03, 755.07, 755.08, 755.09, 324/754.04
See application file for complete search history.

(56) References Cited

U.S. PATENT DOCUMENTS

| | | | |
|---|---|---|---|
| 4,622,514 A | | 11/1986 | Lewis |
| 5,214,375 A * | | 5/1993 | Ikeuchi et al. ........... 324/755.05 |
| 5,625,298 A * | | 4/1997 | Hirano et al. ........... 324/754.08 |
| 6,033,233 A * | | 3/2000 | Haseyama et al. ............ 439/66 |
| 6,499,216 B1 * | | 12/2002 | Fjelstad ........................ 29/842 |
| 6,784,657 B2 | | 8/2004 | Fujishiro et al. |
| 7,074,072 B2 | | 7/2006 | Huebner |
| 7,148,713 B1 * | | 12/2006 | Meek et al. ............. 324/754.14 |
| 7,282,932 B2 * | | 10/2007 | Kirby et al. ............. 324/756.04 |
| 7,456,639 B2 * | | 11/2008 | Watkins et al. ........ 324/754.03 |
| 7,524,194 B2 | | 4/2009 | Eldridge et al. |
| 8,102,184 B2 * | | 1/2012 | Sherry et al. ............. 324/754.03 |
| 2005/0184745 A1 * | | 8/2005 | Machida et al. ............. 324/754 |
| 2008/0007279 A1 * | | 1/2008 | Wood et al. ................. 324/754 |
| 2009/0237099 A1 * | | 9/2009 | Garabedian et al. ......... 324/754 |
| 2009/0256583 A1 * | | 10/2009 | Chen et al. .................... 324/761 |
| 2009/0302878 A1 * | | 12/2009 | Sherry et al. ................. 324/762 |

OTHER PUBLICATIONS

A. Carella, A Passive Vibration Isolator Incorporating A Composite Bistable Plate, Article, Department of Aerospace Engineering, University of Bristol, UK, 4 pages, 2008.

epp-online.de, For Parallel-Dice and Full Arrays, website, Jul. 31, 2009.

* cited by examiner

*Primary Examiner* — Richard Isla Rodas
(74) *Attorney, Agent, or Firm* — Kirton mcConkie (57) ABSTRACT

A microelectronic probe element can include a base, a tip, and a spring assembly coupled between the tip and the base. The spring assembly can include a first spring and a second spring, wherein the first spring has a negative stiffness over a predefined displacement range and the second spring has a positive stiffness over the predefined displacement range. The first spring and second spring can be coupled so that the negative stiffness and positive stiffness substantially cancel to produce a net stiffness of the tip relative to the base over the predefined displacement range.

23 Claims, 7 Drawing Sheets

PROBE ELEMENT HAVING A SUBSTANTIALLY ZERO STIFFNESS AND APPLICATIONS THEREOF

BACKGROUND

Semiconductor devices are typically manufactured in large numbers on a semiconductor wafer. For various reasons, semiconductor devices may fail to perform correctly. Accordingly, as a part of the manufacturing process, various tests of the semiconductor devices are typically performed. Tests can include, for example, functional tests, speed tests and sorting, and burn-in testing. Testing can be performed of a wafer (e.g., before the semiconductor devices are separated from each other by a process called singulation), or of individual semiconductor devices (e.g., held in a carrier after singulation). Making temporary electrical connections to the semiconductor devices to pass test signals to and from the devices can be accomplished using a probe card assembly.

For example, a probe card assembly can include many probes that are arranged to make temporary pressure-based electrical contacts to corresponding terminals (e.g., aluminum bond pads) on the semiconductor devices. A minimum amount of probe contact force can be desirable in order to reliably break through non-conductive oxide layers which can form on some kinds of terminals. Sometimes, it can also be desirable to provide a scrubbing action of the probe relative to the terminal to assist in breaking through the oxide layer.

While a minimum amount of probe contact force can generally necessary, providing too much force can be undesirable. Excessive force can result in probes being broken or damaged (e.g., permanently bent). Excessive force or excessive scrubbing action can also result in damage to the terminal (e.g., large scrub marks, cracked terminals, etc.). Accordingly, it can be difficult to provide a proper balance between providing enough force to provide a reliable electrical contact and not so much force that the probe or terminal is damaged.

With continuing trend towards larger wafers and larger numbers of interconnects, the above-mentioned challenges become even greater. As probe card assemblies become larger, it can be more difficult to provide probes which are aligned with each other in a common plane. Alignment between the probe card assembly and wafer under test also becomes more challenging. Errors in planarity or alignment can result in excessively high forces on some probes and inadequate forces on other probes.

Managing contact forces on a probe card assembly having many thousands of probes can be challenging. In order to accommodate some misalignment, probes can be made to provide a spring-like character. In use, the probe card can be brought into contact with the wafer under test, and then the probe card and wafer pushed further together by a distance referred to as over travel. Providing probes enough over travel to ensure that all probes make reliable contact can be difficult. Increasing the amount of over travel can also present problems, as this increases the force on the probes. As noted above, increased forces can result in damage to the probes or terminals of the semiconductor devices.

As the number of contacts increases, the total force applied to the probe card assembly also increases in proportion to the number of probes. These high forces can be difficult to manage, as they can bend or warp the probe card assembly itself, aggravating alignment and non-planarity challenges.

SUMMARY

In some embodiments, a microelectronic probe element can include a base and a tip electrically connected to the base. The tip can include a conductive material suitable for making pressure based electrical contact to a microelectronic device. A spring assembly can be coupled between the tip and the base, and have a net spring characteristic relative to the base over a predefined displacement range. The spring assembly can include a first spring having a first spring characteristic with a negative stiffness over the predefined displacement range, and a second spring having a second spring characteristic with a positive stiffness over the predefined displacement range. The positive stiffness can substantially cancel the negative stiffness to produce the net spring characteristic.

In some embodiments of the invention, a probe card assembly can include a rigid substrate having an electrical interface and a plurality of probes coupled to the substrate. The probes can be arranged to contact terminals of a microelectronic device, and can be electrically connected to the electrical interface through electrical connections of the substrate. The probes can include a first spring element and a second spring element having spring characteristics that are complementary to each other over a predefined displacement range.

A process of using a probe card assembly can include obtaining a probe card assembly that has a plurality of probes. The probes can be coupled to a substrate, each have a tip, and be arranged so that the tips can contact corresponding terminals of a microelectronic device. The probes can each include a first spring element and a second spring element. The process can include positioning the probe card assembly and the microelectronic device together to make contact between the probes and the terminals, and displacing the probe card assembly and the microelectronic device together by an initial over travel displacement. The process can also include increasing displacement of the probe card assembly relative to the microelectronic device by an additional over travel displacement. The probes can deflect and develop an initial contact force in response to the initial over travel displacement. The initial contact force can be obtained by a combination of positive stiffness of the first spring element and positive stiffness of the second spring element. The probes can deflect and provide a sustained contact force in response to the additional over travel displacement. The sustained contact force can be maintained by a combination of positive stiffness of the first spring element and negative stiffness of the second spring element so that it is substantially independent of the additional over travel displacement.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on or attached to or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In some figures, "x," "y," and "z" axes are provided in accordance with a right-hand coordinate system for ease of discussion and illustration but not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
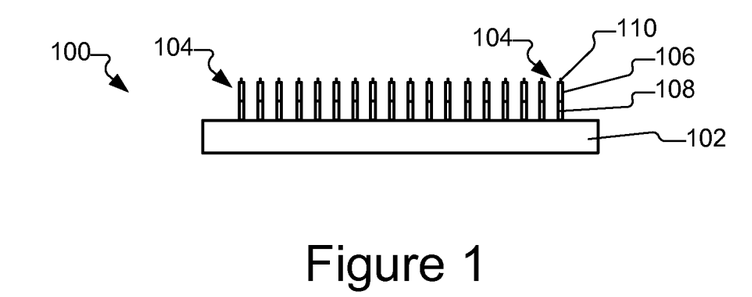
FIG. 1 illustrates a side illustration of a probe head assembly according to some embodiments of the invention.

FIG. 1 illustrates a schematic depiction of a probe head assembly which can address some of the aforementioned challenges. The probe head assembly 100 can include a rigid substrate 102, on which a plurality of probes 104 are disposed. For example, the substrate can be a rigid material (e.g., ceramic) or a semi-rigid material (e.g., fiberglass resin). The probes 104 can be arranged in positions corresponding to terminals (not shown) of a microelectronic device (not shown) so that, when brought together with the microelectronic device, each of the probes contacts a corresponding one of the terminals. A microelectronic device can include one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and other types of electronic device or devices. The probe head assembly 100 can also include electrical circuitry, for example, as described further below.

Various types of probes can be used as will be described in further detail below. Electrical connections can be provided to the probes 104, for example through printed circuit board traces (not shown) disposed on or within the rigid substrate 102 which connect the probes to connectors, terminals, or other interconnection features (not shown). For example, the probe head assembly 100 can be used in a probe card assembly as described further below.

Turning to the probes 104, the probes can include a combination of coupled together spring elements that have complementary spring characteristics over a predefined displacement range that result in a net stiffness of the probes that is substantially zero over the predefined displacement range. By substantially zero stiffness is meant that the contact force produced by the probe remains approximately constant regardless of displacement of the spring over the predefined range. In contrast, a conventional spring provides a positive stiffness, by which is meant that the contact force produced by the spring increases with increasing displacement. For example, for a linear spring, stiffness can be a constant having units of force divided by distance (e.g., Newtons per meter). In general, the stiffness of a spring is a quantity equal to the change in force versus the change in displacement of the spring. In general, stiffness can take on different values as a function of the displacement of the spring (a constant stiffness spring is also known as a linear spring). Accordingly, a spring characteristic can be defined in terms of the stiffness of the spring as a function of displacement. Spring stiffness is also sometimes referred to as spring rate (or, in the case of a linear spring, spring constant). Spring compliance is the inverse of spring stiffness, and thus can be expressed in units of distance divided by force (e.g., microns per gram). Accordingly, it will be appreciated that spring characteristics can be described in terms of compliance or stiffness.

The probes 104 can include a first spring 106 and a second spring 108, which are coupled together. In some embodiments, the first spring 106 and the second spring 108 can be distinct elements which are joined together. In some embodiments, the first spring 106 and the second spring 108 can be an integral spring unit formed from the same material. The first spring 106 and the second spring 108 can provide a net positive stiffness over an initial displacement range and provide substantially zero stiffness over the predefined displacement range. When the tip 110 of a probe 104 is brought into contact with a terminal and displaced by an amount equal to the initial displacement range, the positive stiffness will result in the probe 104 developing an initial contact force at the tip 110. The initial displacement range can be selected as desired, and the probe can be designed so this initial contact force is equal to or greater than the desired minimum contact force. The predefined displacement range can correspond to a range of displacements greater than the initial displacement range. After the initial displacement produces the initial contact force, increased displacement into the predefined displacement range can result in a contact force which is substantially the same as the initial contact force. Thus, additional over travel can be performed (within the predefined displacement range) without resulting in substantially increased contact forces on the individual probes. This can help to reduce the impact of misalignments and lack of planarity as will become more apparent from the following discussion.

Figure 2:
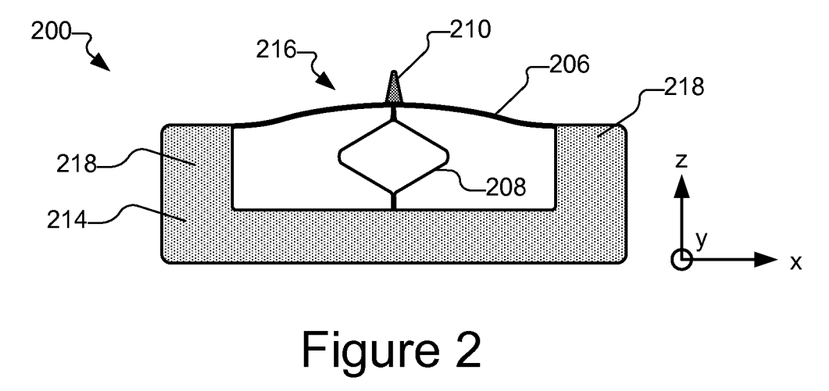
FIG. 2 is a side view illustration of a probe element according to some embodiments of the invention.

FIG. 2 illustrates one configuration of a probe 200 which can be used as the probe 104 in the probe head assembly of FIG. 1. The probe 200 can include a base 214. The base 214 can include, for example, posts 218 to support each end of the second spring 206. A tip 210 can be electrically connected to the base 214, and can include a conductive material suitable for making pressure based electrical contact to a microelectronic device. For example, the tip 210 can include materials such as palladium, gold, rhodium, nickel, cobalt, silver, platinum, conductive nitrides, conductive carbides, tungsten, titanium, molybdenum, rhenium, indium, osmium, rhodium, copper, refractory metals, and their alloys including combinations of the foregoing, or other materials.

A spring assembly 216 can be coupled between the tip 210 and the base 214. The base 214 and spring assembly 216 can include materials such as described above for the tip 210, although the tip 210, base 214, and spring assembly 216 need not be the same materials. The tip 210 can be electrically coupled to the base 214 through the spring assembly 218 (e.g., using conductive material for the spring assembly), or through other electrical connections (e.g., using a conductive wire (not shown) connected from the tip 210 to the base 214). The tip 210 can be mounted on the spring assembly 216. As another example, the tip 210 can be an integral part of the spring assembly 216.

The probe element 200 can be substantially planar, in that the dimension of the probe element in the y direction (in/out of the plane of the drawing) can be substantially smaller than the dimensions in the x (horizontal) direction and z (vertical) directions. For example, the probe element can have a width (x direction) of about 3 millimeters, a height (z direction) of about 1.5 millimeters, and a thickness (y direction) of about 30 micrometers. Such a probe element can be used, for example, to contact bond pads having a spacing of 30 micrometers or more. Of course, the probe element is not limited to these dimensions, and others sizes and shapes can be used. For example, the width can be between 500 micrometers and 5 millimeters, the height between about 500 micrometers and 5 millimeters, and the thickness between about 10 micrometers and 1 millimeter. The foregoing values are example of dimensions, and other dimensions can be used, including dimensions smaller or larger than those described above.

The spring assembly 216 can provide a substantially zero stiffness over a predefined displacement range. The spring assembly can, for example, include a first spring 206 and a second spring 208. The first spring can have a spring characteristic which includes a negative stiffness over the predefined displacement range. For example, the first spring 206 can have a diaphragm shape. The diaphragm shape can provide a bi-stable spring. A bi-stable spring has a negative stiffness region, and thus has two stable positions corresponding to displacements at each end of the region of negative stiffness. When displaced into the negative stiffness region, a bistable spring will tend to snap through to the other end of the negative stiffness region. The second spring 208 can, for example, have a trapezoidal shape, for example as shown in FIG. 2. This can provide a positive and substantially linear spring characteristic. The force provided by the second spring can thus substantially increase in proportion to the displacement. Other shapes and configurations of the first spring 206 and the second spring 208 can be used.

The first spring 206 can have a non-linear spring characteristic. The second spring 208 can have a spring characteristic which includes a positive stiffness over the predefined displacement range. The second spring 208 can have a linear or non-linear spring characteristic. The first spring 206 and the second spring 208 can be coupled together (e.g., in parallel as shown here) so that the negative stiffness of the first spring substantially cancels the positive stiffness of the second spring to produce a net spring characteristic of the probe tip relative to the base having substantially zero stiffness. Accordingly, over the predefined displacement range, the probe 200 can provide a substantially constant contact force.

Figure 3:
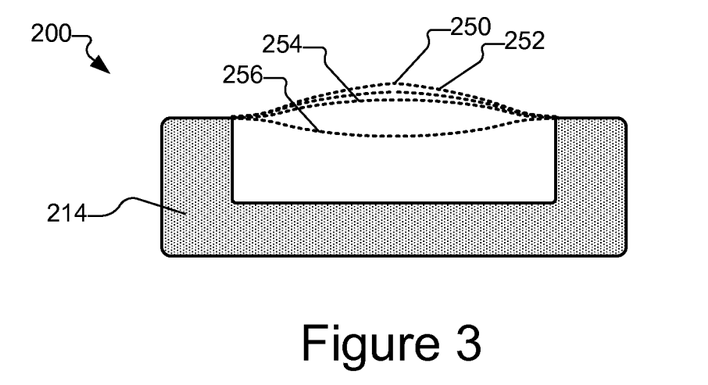
FIG. 3 is a side view illustration of the probe element of FIG. 2 in various positions with portions of the probe element omitted for clarity of illustration.

FIG. 3 illustrates operation of the spring assembly 200 in further detail (the tip 210 and the second spring 208 are omitted for clarity of illustration). The position of the first spring 206 is shown in four different alternate positions. Position 250 can correspond to a resting position (e.g., no displacement or force applied to the tip 210). Position 252 can correspond to an initial displacement position 252, at which a desired contact force is produced by the tip 210. Position 254 and position 256 can correspond to ends of the negative stiffness region of the second spring 208.

Over an initial displacement range, between the resting position 250 and the initial displacement position 252, both the first spring 206 and the second spring 208 can resist displacement and thus provide positive stiffness at the tip 210. This can produce an initial contact force at the tip 210. With further displacement of the tip 210, the predefined displacement range can be entered. For example, when the displacement exceeds the end of the negative stiffness region of the first spring 206 (i.e., greater displacement than position 254), the first spring 206 has a tendency to snap through to the other end of the negative stiffness region (i.e., to position 256) if unconstrained. In other words, the first spring 206 provides a force which tends to increase further displacement within the negative stiffness region. The first spring 206 can be constrained by the second spring 208, however, so that the second spring 208 prevents the first spring 206 from snapping through from position 254 to position 256. The second spring 208 can thus provide a counterbalancing force which opposes the force produced by the first spring 206. By configuring the first spring 206 and second spring 208 so that these counterbalancing forces are approximately equal, the net stiffness of the spring assembly 216 can have substantially zero stiffness over the predefined displacement range. In other words, the positive stiffness of the second spring 208 can substantially cancel the negative stiffness of the first spring 206 over the predefined displacement range.

With further increasing displacement (i.e., beyond position 256), the first spring 206 enters a positive stiffness region, and begins to resist further displacement. Thus, the net spring characteristic of the tip 210 can exhibit an initial positive stiffness followed by a region of substantially zero stiffness, and then a region of positive stiffness over successively increasing displacement.

Figure 4:
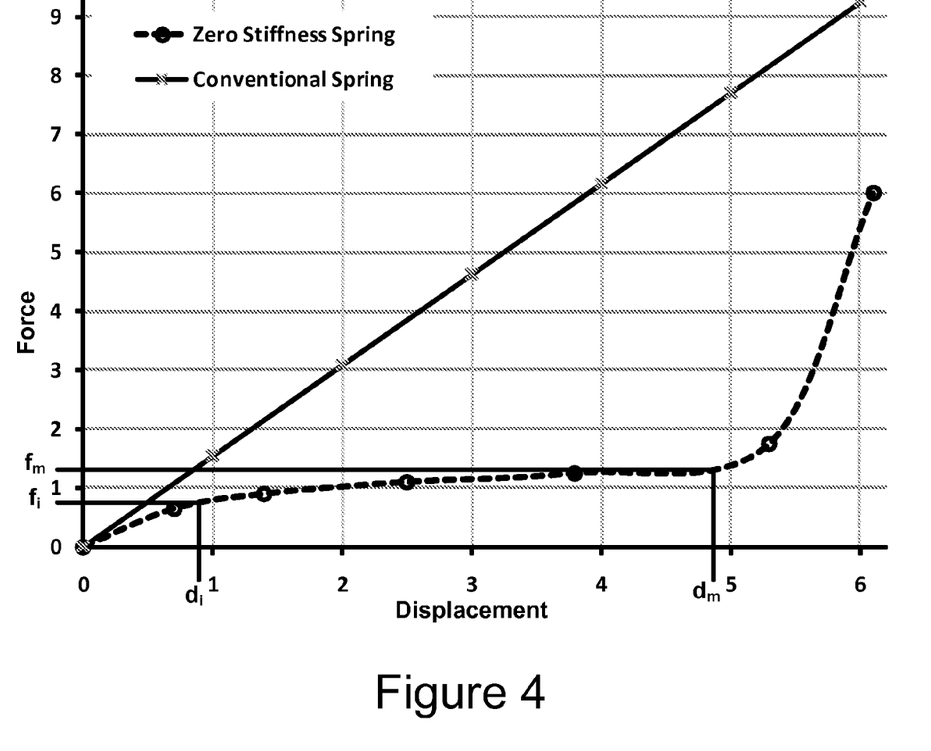
FIG. 4 is graph of contact force versus displacement of a probe element according to some embodiments of the invention as compared to a conventional spring probe element.

General behavior of a probe, such as for example probe 200, is illustrated in FIG. 4 which provides a comparison of the net spring characteristic of the probe 200 (open circles/ dashed line) as compared to a conventional probe having a linear spring characteristics (solid line). Contact force is shown in the vertical axis and displacement is shown in the horizontal axis. It can be seen that the probe 200 provides a positive stiffness for displacements between 0 and $d_i$, where $d_i$ corresponds to an initial displacement amount (e.g., an initial displacement region of 0 to $d_i$). In this initial region, both springs resist displacement, and the contact force increases substantially linearly with displacement, rising from 0 to an initial contact force, $f_i$. The resulting values for the initial displacement and initial contact force are a function of the dimensions and materials used to construct the probe.

For example, the probe can be designed to provide an initial displacement between 0 and about 100 micrometers, between 0 and about 40 micrometers, between 0 and about 15 micrometers, and between 0 and about 5 micrometers. The foregoing values are examples of initial displacement ranges, and other displacement ranges can be used, including ranges greater than 100 micrometers. The probe can be designed so the initial contact force resulting from the initial displacement is about 200 milliNewtons (mN), about 50 mN, about 15 mN, and about 10 mN. The foregoing values are examples of initial contact force, and other contact forces can be used, including contact forces less than 10 mN, greater than 200 mN, and forces in between the foregoing examples.

For displacements greater than the initial displacement $d_i$, up to a maximum displacement $d_m$, is a region where the first spring is trying to snap through (e.g., aiding further deformation) and the second spring is resisting further deformation, resulting in a relatively constant contact force. Accordingly, for displacement within this region, the contact force produced is relatively constant and is substantially equal to the initial contact force $f_i$. In this particular example, the contact force increases slightly to a maximum $f_m$. In other words, over the range of displacements from $d_i$ to $d_m$, the probe 200 exhibits a substantially zero stiffness. For displacements greater than the maximum displacement $d_m$, positive stiffness is again provided, where both the first spring and the second spring resist further deformation. Thus, a predefined displacement region (e.g., $d_i$ to $d_m$) can be defined. While the initial displacement region and predefined displacement region are shown as being contiguous to each other, the invention is not so limited.

The maximum displacement $d_m$ and maximum contact force $f_m$ can determined by the dimensions and materials used to construct the probe. For example, the probe 200 can be designed to provide a maximum displacement of about 800 micrometers, about 225 micrometers, about 100 micrometers, and about 50 micrometers. The foregoing values are examples of maximum displacement, and other maximum displacements can be used, including maximum displacement less than 50 micrometers, greater than 800 micrometers, or values in between the foregoing examples. The maximum contact force can be equal to about 250 mN, about 60 mN, about 20 mN, about 15 mN. The foregoing values are examples of maximum contact force, and other maximum contact force can be used, including maximum contact force less than 15 mN, greater than 250 mN, or values in between the foregoing examples. Thus, the contact force can be maintained to be substantially constant, where the contact force remains within a range of about 200-250 mN, about 50-60 mN, about 15-20 mN, and about 10-15 mN. The foregoing values are examples of substantially constant contact force ranges, and other force ranges can be used, including larger and smaller ranges.

In general, using techniques disclosed herein, a probe can provide a substantially constant contact force over the predefined displacement range which is equal to a nominal contact force $f_n$ within a tolerance $\epsilon$; e.g., $f_i < f_n - \epsilon$ and $f_n + \epsilon < f_m$. In other words, the contact force over the displacement range is within equal to the desired contact force $f_n$ plus or minus a variation less than a tolerance $\epsilon$. The nominal contact force can be, for example, 220 mN, 55 mN, 15 mN, and 10 mN. The foregoing values are examples of nominal contact force, and other nominal contact force can be used, including less than 10 mN, greater than 220 mN, and values in between the foregoing values. The allowable variation (tolerance) can be, for example, 30 mN, 10 mN, and 5 mN. The foregoing values are examples of allowable variation, and other variation can be used, including amounts less than 5 mN, greater than 30 mN, and values between the foregoing examples.

It can be seen that the probe 200 can provide a substantially larger operating range as compared to the conventional probe. For example, by including a substantially zero stiffness region (e.g., between $d_1$ and $d_m$), the probe 200 can maintain a contact force between $f_i$ and $f_m$ over a ten times larger displacement range (e.g., relative displacement between about 0.8 and about 4.7) than the zero stiffness spring (e.g., relative displacement between about 0.5 and about 0.8). Looking at this in another way, the probe 200 can develop adequate contact forces over a comparable initial displacement as the conventional probe, but the probe 200 can maintain significantly smaller contact for large amounts of over travel as compared to the conventional probe.

It is not necessary for the positive stiffness of the second spring to exactly cancel the negative stiffness of the first spring. Thus, the positive stiffness and the negative stiffness need only have a substantially equal magnitude within a tolerance corresponding to the desired maximum deviation from zero stiffness. For example, as shown in FIG. 4, a substantially zero stiffness can be provided wherein there is a very small positive slope, corresponding to the positive stiffness of the second spring being slightly larger in magnitude than the negative stiffness of the first spring. Conversely, if the negative stiffness of the first spring slightly exceeds the positive stiffness of the second spring, the substantially zero stiffness can have a slightly negative characteristic over the predefined displacement range. Provided that the net contact force remains above the minimum desired contact force, this deviation from exactly zero stiffness can be acceptable. Accordingly, a substantially zero stiffness can include small amounts of positive or negative stiffness, wherein the deviation from zero can be within tolerable limits for the particular application of the probe.

If desired, the probe can provide a scrubbing action of the tip as the probe tip is displaced relative to the base. For example, as the probe tip is displaced toward the base, the probe can move laterally (e.g., in a different direction than the direction of displacement) relative to the base to produce a wiping action. For example, when contacting the terminal of a microelectronic device, application of contact force to the tip can cause the tip to both deflect in the direction of the contact force as well as move laterally in a direction perpendicular to the contact force. This can cause the tip to slide across the terminal, helping to break through oxide layers or other contaminants on the terminal.

Various techniques for producing this scrubbing action can be included in a probe element. Accordingly, a probe head can include means for producing wiping movement of the tip of the probe in response to an initial displacement. The means for producing wiping movement can be, for example, any one or more of: an off-center tip, asymmetry in the first spring, asymmetry in the second spring, asymmetry in the connections between the first spring and the second spring, the geometry of the tip, asymmetric base support of the spring assembly, and structure positioned between the tip and the spring assembly, such as examples described below.

Figure 5:
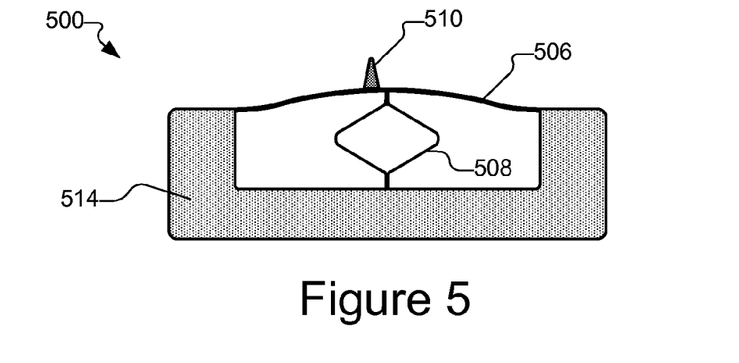
FIG. 5 is a side view illustration of a probe element having an asymmetrically positioned tip to provide a wiping action according to some embodiments of the invention.

FIG. 5 illustrates a probe element 500 which includes a tip 510 on a first spring 506. The tip 510 can be like the tip 210 of FIG. 1, except that the tip 510 can be off center relative to either the first spring 506 or the second spring 508. As the probe element 500 is compressed (e.g., by being brought into contact with a microelectronic device) the tip 510 moves downward toward the base 514 and the tip 510 can follow an arcuate path resulting in slight movement laterally. The first spring 506 and the second spring 508 can be like the first spring 206 and the second spring 208 of FIG. 1. The springs can be mounted to a base 514, which can be like the base 214 of FIG. 2.

Figure 6:
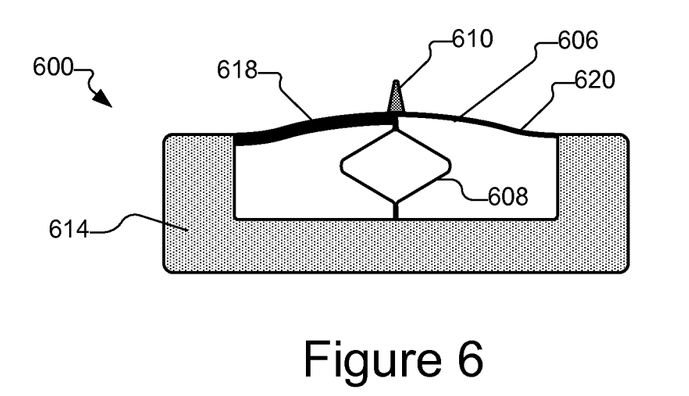
FIG. 6 is a side view illustration of a probe element having an asymmetric first spring to provide a wiping action according to some embodiments of the invention.

Scrubbing action can be provided by asymmetry in the first spring, the second spring, or both. In general, one or more springs coupling the probe tip to the base can be asymmetric in geometry or connection to provide a scrubbing action. For example, FIG. 6 illustrates a probe element 600 wherein the first spring 606 can be asymmetric. A first portion 618 of the first spring 606 can be thicker than a second portion 620 of the first spring 606. Thus, as the first spring 606 is deflected, it moves asymmetrically (for example, the first portion 618 resists deformation more than the second portion 620). Thus, as contact pressure is applied to the tip 610, this pushes the first spring 606 downward toward the base 614. The second portion 620 of the first spring 606 will bend and curve, while the first portion 618 of the first spring 606 will stay relatively straight. This will cause the lateral position of the tip 610 to be deflected slightly to the right of its original position as the second spring 606 is deflected. The tip 610, the second spring 608, and the base 614 can be like the tip 210, the second spring 208 and the base 214 of FIG. 2.

Figure 7:
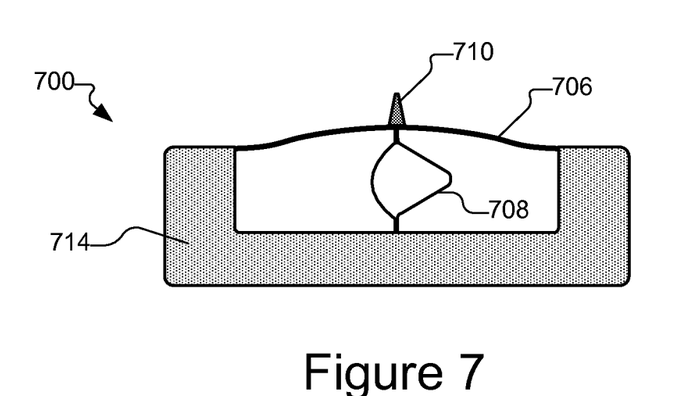
FIG. 7 is a side view illustration of a probe element having an asymmetric second spring to provide a wiping action according to some embodiments of the invention.

FIG. 7 illustrates an alternate arrangement of a probe element 700 wherein the second spring 708 can be asymmetric. As the second spring 708 deflects, its asymmetry can result in lateral (horizontal, relative to the base) forces being applied to the first spring 706. This can cause the lateral position of the tip 710 to move relative to the center of the probe element 700. The tip 710, the first spring 706, and the base 714 can be like the tip 210, first spring 206 and base 214 of FIG. 1.

Figure 8:
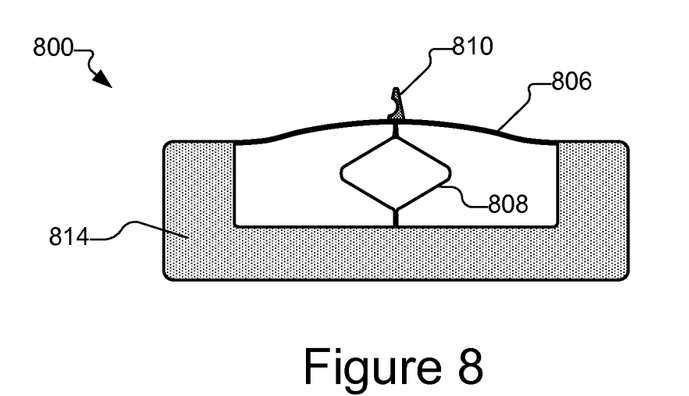
FIG. 8 is a side view illustration of a probe element having an asymmetric tip geometry to provide a wiping action according to some embodiments of the invention.

An alternate arrangement of a probe element is shown FIG. 8 which provides a scrubbing action through different techniques. The probe element 800 can include a tip 810 which can have a geometry arranged to provide scrubbing action. For example, the tip 810 can have a shape which bends laterally when contact force is applied. For example, the tip can have an asymmetric shape which causes the tip 810 to flex to its side as compressed. The tip 810 can be made of similar materials as tip 210 of FIG. 1. The first spring 806, the second spring 808, and the base 814 can be like the first spring 206, the second spring 208, and the base 214 of FIG. 1.

Figure 9:
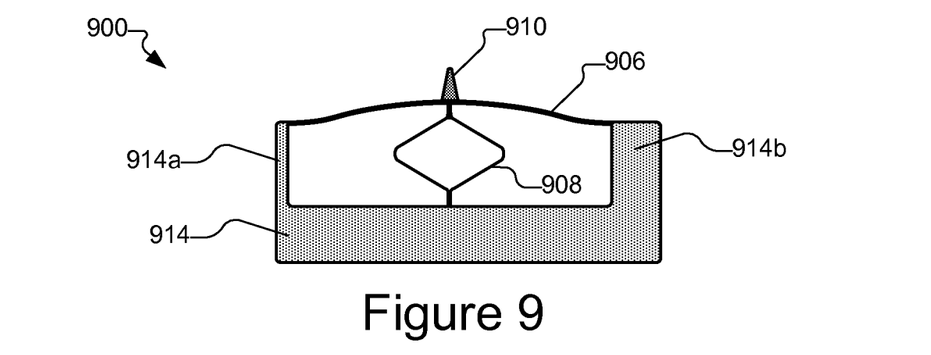
FIG. 9 is a side view illustration of a probe element having an asymmetric base geometry to provide a wiping action according to some embodiments of the invention.
Figure 10:
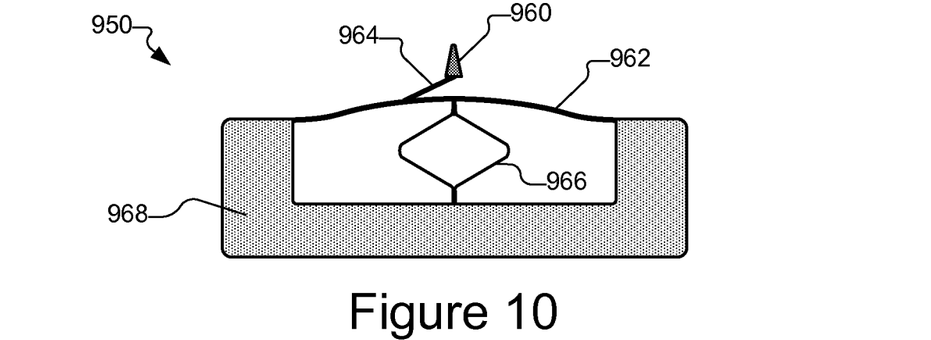
FIG. 10 is a side view illustration of a probe element having a wiping structure coupled to the tip to provide a wiping action according to some embodiments of the invention.

FIG. 9 illustrates another arrangement of a probe 900 with scrubbing action. The base 914 can include asymmetric support portions 914a, 914b. As the tip 910 is deflected, the left side support portion 914a can deflect laterally (e.g., acting like a cantilevered beam) while the right side support portion 914b remains fixed. This can allow the tip 910 to deflect laterally (in this example, towards the left). The tip 910, the first spring 906, and the second spring 908 can be like the tip 210, the first spring 206, and the second spring 208 of FIG. 2. As the first spring 906 and the second spring 908 deflect, the left FIG. 10 illustrates another arrangement of a probe 950 with scrubbing action. A tip 960 can be coupled to a first spring 962 through a wiping structure 964 to produce scrubbing action to the tip. The wiping structure can include, for example, a cantilevered beam. The tip 960, the first spring 962, a second spring 966, and the base 968 can be like the tip 210, the first spring 206, the second spring 208, and the base 214 of FIG. 2.

As yet another example, scrubbing action can be provided by asymmetry in the connections of the first spring to the second spring (e.g., connecting the second spring somewhere other than the center of the first spring).

Various numbers and arrangements of springs can be used. Springs can be operated in compression (e.g., as shown above) or in tension. Two or more springs can be arranged in parallel (e.g., as shown above), in series, or combinations of springs can include some in parallel and some in series. Springs are said to be arranged in parallel when each of the springs sees the same displacement. When arranged in parallel, the spring characteristics add. In other words, the net stiffness of the tip (relative to the base) is equal to the sum of the stiffness of each spring placed in parallel between the tip and the base. Compliance of the tip is therefore equal to the inverse of the sum of the inverse of the compliance of each spring placed in parallel between the tip and the base.

Alternatively, the springs can be arranged in series. Springs are said to be arranged in series when each of the springs sees the same force. When placed in series, the net compliance of the tip is equal to the sum of the compliance of each spring placed in series between the tip and the base (where the compliance is the inverse of the stiffness). Stiffness of the tip is therefore equal to the inverse of the sum of the inverse of the stiffness of each spring placed in series between the tip and the base.

Figure 11:
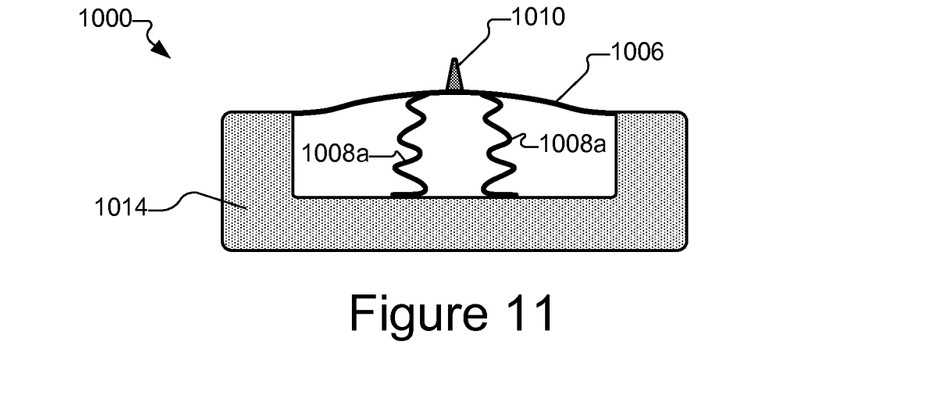
FIG. 11 is a side view illustration of a probe element having an alternate parallel arrangement of springs according to some embodiments of the invention.

FIG. 11 illustrates an embodiment of a probe element 1000 which includes three springs. A first spring 1006 can be like the first spring 206 described above, providing negative stiffness. A second spring 1008a and a third spring 1008b, can provide positive stiffness. All three of the springs 1006, 1008a, 1008b are in parallel. A tip 1010 and base 1014 can be like the tip 210 and the base 214 of FIG. 2. Scrubbing action can be provided to the tip 1010 by making the stiffness of the second spring and third spring different, or by any of the techniques illustrated above in FIG. 5 through FIG. 9.

Figure 12:
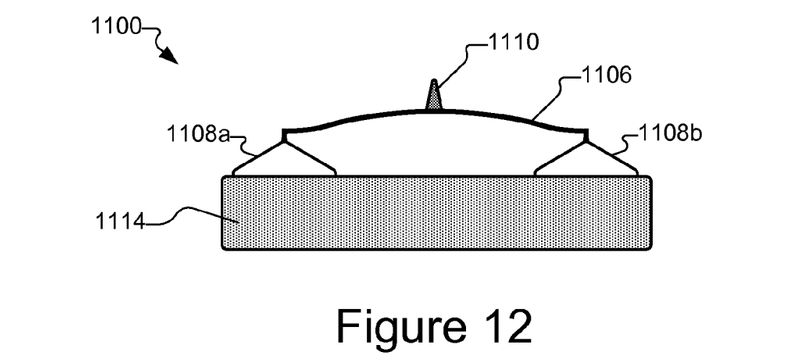
FIG. 12 is a side view illustration of a probe element having a series and parallel arrangement of springs according to some embodiments of the invention.

FIG. 12 illustrates an embodiment of a probe element 1100 which includes springs 1106, 1008 in both a series and parallel arrangement. A first spring 1106 is in series with the parallel combination of a second spring 1108a and a third spring 1108b. The first spring 1106 can provide a negative stiffness over a predefined displacement range, and can be supported by the second spring 1180a and the third spring 1108b. The first spring 1106 can be like the first spring 206 of FIG. 2. The second spring 1180a and the third spring 1108b can provide positive stiffness over the predefined displacement range. The second spring and the third spring can be like the top half of the second spring 206 of FIG. 2. A tip 1110 and a base 1114 can be like the tip 210 and the base 214 of FIG. 2. Scrubbing action can be provided to the tip 1110 by making the stiffness of the second spring 1180a and the third spring different 1108b, or by any of the techniques illustrated above in FIG. 5 through FIG. 10.

Figure 13:
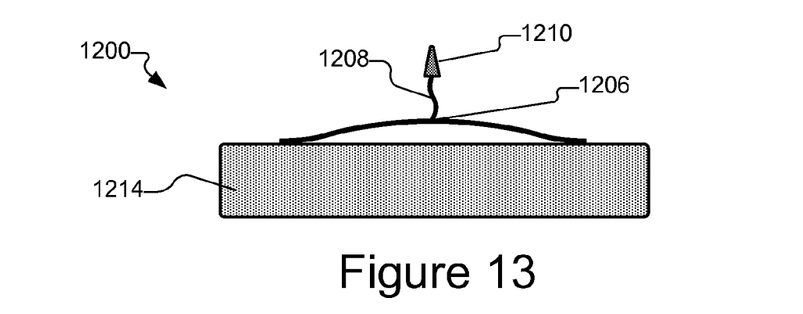
FIG. 13 is a side view illustration of a probe element having a series arrangement of springs according to some embodiments of the invention.

FIG. 13 provides an example of a probe element 1200 with another series arrangement of springs. A tip 1210 (which can be like the tip 210 of FIG. 1) can be coupled to a first spring 1208. The first spring 1208 can be, for example, an overcoated wire, cantilevered probe, needle, or the like. The first spring can provide positive stiffness. The first spring 1208 can be coupled to a second spring 1206. The second spring 1206 can provide negative stiffness. The second spring 1206 can be like the first spring 206 of FIG. 2 and can be mounted to a base 1214 which can be like the base 214 of FIG. 2. Scrubbing action can be provided to the tip 1210 using any of the techniques described above in FIG. 5 through FIG. 10.

Probe elements as described above can be made and affixed to a substrate in various ways. For example, the probe element can be made in a plane using a various processes such as lithography, laser cutting, stamping, die cutting, and the like.

Using lithography, the probe element can be manufactured on a sacrificial or reusable substrate. A desired shape for the probe element can be defined using a mask, and then metal applied (e.g., by deposition or plating) to create the probe element. Once completed, the probe element can be removed from the sacrificial or reusable substrate. Various approaches to lithographic manufacture can be used and need not be described further.

As another example, the probe element can be stamped or cut from stock material. The stock material can include palladium, gold, rhodium, nickel, cobalt, silver, platinum, conductive nitrides, conductive carbides, tungsten, titanium, molybdenum, rhenium, indium, osmium, rhodium, copper, refractory metals, and their alloys including combinations of the foregoing, or other materials.

If desired, the springs, tip, and base can all be formed or cut at the same time (e.g., from the same material). Alternatively, the springs can be made and a separately made tip attached (e.g., by soldering, brazing, welding, gluing, or the like). As yet another example, the spring can be made and attached to a separately formed base and tip.

Completed or partially-completed probes can be attached to a substrate using soldering, brazing, welding, gluing, or similar attachment techniques. For example, probes can be attached to make a probe head 100 as described above.

Figure 14:
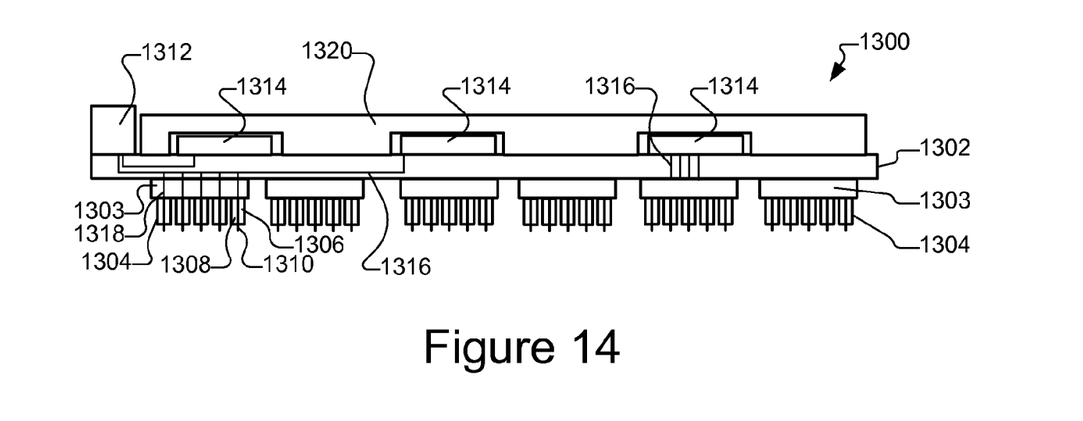
FIG. 14 is a side view illustration of a probe card assembly according to some embodiments of the invention.

FIG. 14 illustrates an example of a probe card assembly in accordance with some embodiments of the invention. The probe card assembly 1300 can include a substrate 1302, to which a plurality of probe substrates 1303 can be coupled. The substrate 1302 can be rigid (e.g., ceramic) or semi-rigid material (e.g., fiberglass resin). If desired, a stiffener 1320 can be coupled to the substrate 1302 to provide additional rigidity. For example, the substrate 1302 can be a printed circuit board, and the stiffener 1320 can be a metallic structure coupled to the printed circuit board at a plurality of points. Substrate 1302 can include internal electrical traces 1316.

The probe substrates 1303 can be mechanically and electrically coupled to the substrate 1302. If desired, the probe substrates 1303 can be mounted in an adjustable orientation relative to the substrate 1302 and/or to each other. Various ways of providing adjustable orientations can be used, including for example, controllable actuators, differential screws, shims, and the like. Alternately, the probes can be attached directly to the substrate 1302 and the probe substrates 1303 omitted. As another example, additional intermediary substrates (not shown) can be provided between the probe head substrates 1303 and the substrate 1302 (e.g., an interposer).

Probes 1304 can be disposed on the probe substrates 1303. For example, each probe substrate can correspond to one, two, or more microelectronic devices on a wafer under test. The probes can each include a first spring 1306, a second spring 1308, and a tip 1310. For example, the probes can be like any of the probes described above and illustrated in FIGS. 1-13. The probes 1304 can be electrically connected via electrical connections 1318 to electrical connections 1316 within the substrate 1302. Thus, electrical connections between the probes 1304 and an electrical interface 1312 can be made through electrical connections 1316, 1318 within the substrate 1302 and probe substrates 1303.

The substrate 1302 can, if desired, include electrical circuitry, such as for example, devices 1314 mounted to the substrate (e.g., placed directly on the substrate or placed on other substrates attached thereto, such as a daughter card). The devices 1314 can include circuitry to facilitate operation of the probe card assembly 1300 (e.g., switches, multiplexers, test signal generators, response signal comparators, test circuitry, etc.). The electrical circuitry can be connected to the electrical interface 1312 and the probes 1304 via electrical connections 1316. For example, the electrical connections 1316 can be printed circuit board traces disposed on or within layers of the substrate 1302.

Figure 15:
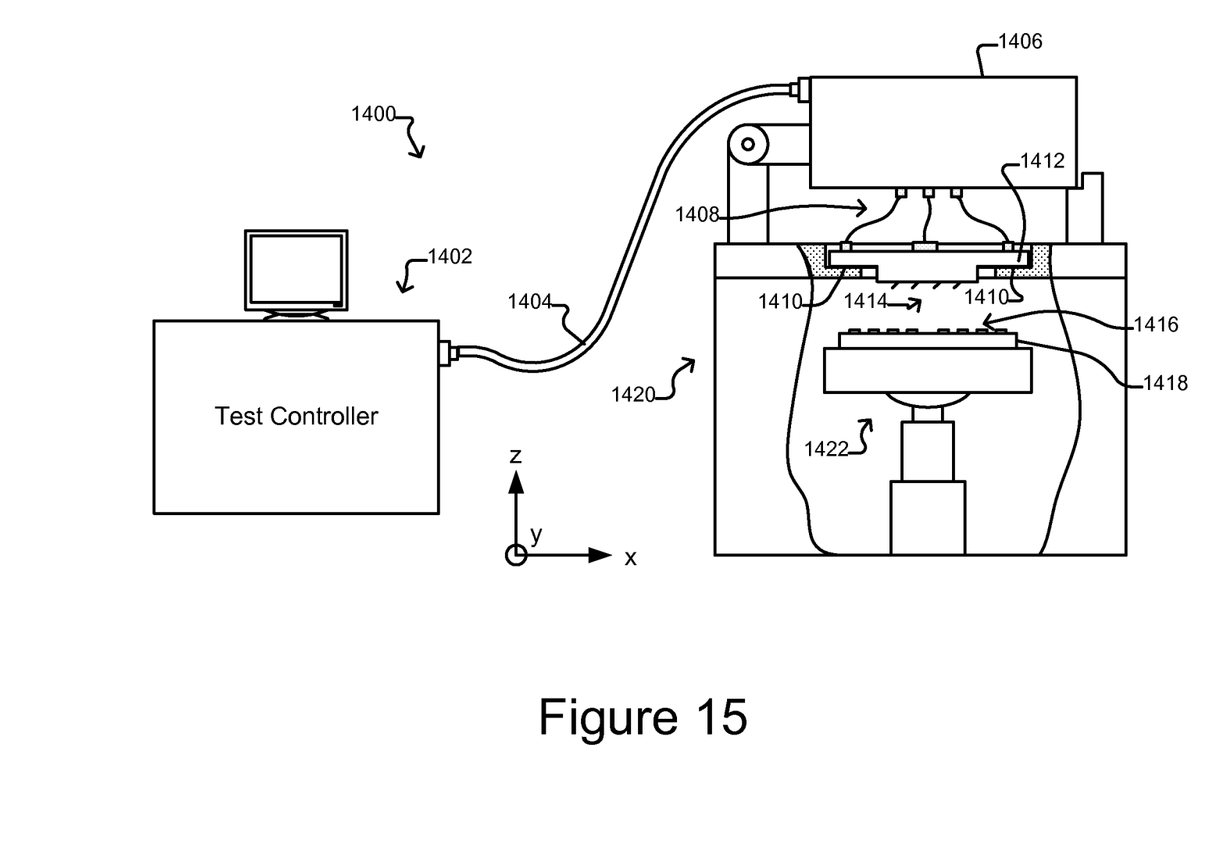
FIG. 15 is a schematic illustration of a test system according to some embodiments of the invention.
Figure 16:
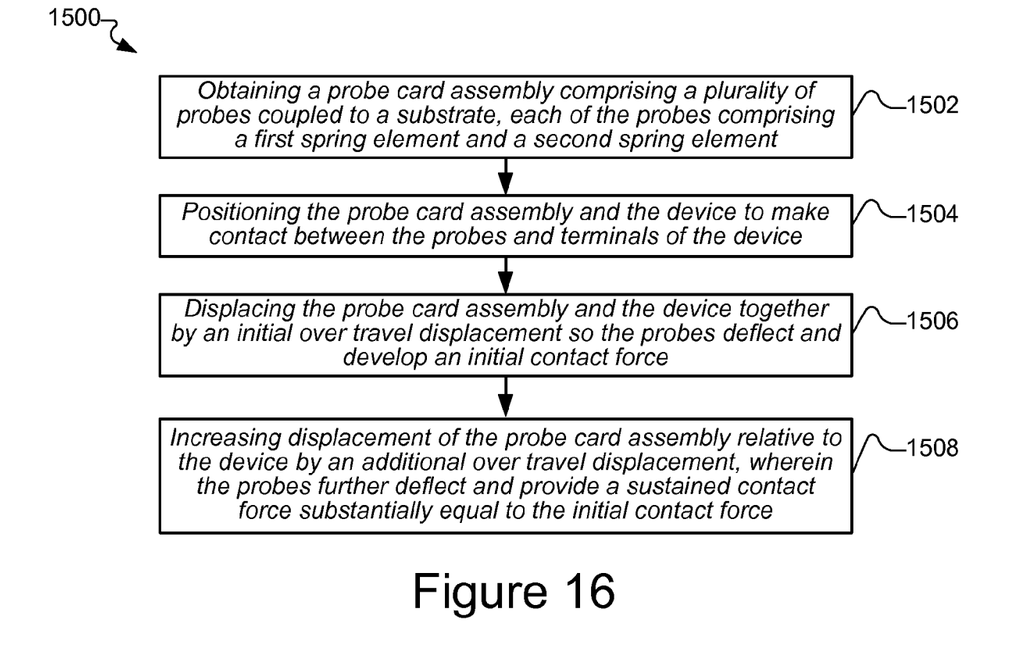
FIG. 16 is a flow chart of a process of using a probe card assembly according to some embodiments of the invention.

Use of a probe card assembly will now be described in conjunction with FIGS. 15 and 16. FIG. 15 illustrates a test system 1400 for testing electronic devices. A test controller 1402 can provide input signals to the electronic devices 1418 and can receive response signals generated by the electronic devices 1418 in response to the input signals. The electronic devices 1418 can be, for example, microelectronic devices as described above. The term "test signals" can refer generically to the input signals generated by the test controller 1402, the response signals generated by the electronic devices 1418, or both. The test system 1400 can include a probe card assembly 1412, which can be like the probe card assembly 1300 of FIG. 14 (and can include probes like those illustrated in any of FIGS. 1-13). The probes 1414 of the probe card assembly 1412 can make pressure-based electrical connections with terminals 1416 of the electronic devices 1418. The test signals can be passed between the test controller 1402 and the electronic devices 1418 through a connection 1404 (e.g., a coaxial cable, a wireless link, a fiber optic link, etc.), electronics (not shown) in a test head 1406, connectors 1408 between the test head 1406 the probe card assembly 1412, and the probe card assembly 1412. The probe card assembly 1412 can be coupled to a mounting surface 1410 of a housing 1420 (e.g., a prober) that includes a moveable chuck 1422 on which the electronic devices 1418 are disposed. The chuck 1422 can move the electronic devices 1418 such that terminals 1416 of the electronic devices 1418 are pressed against probes 1414 of the probe card assembly 1412. Alternatively or in addition, the probe card assembly 1412 can be moved.

Referring to both FIGS. 14 and 15, a first operation 1502 in a process 1500 of using a probe card assembly can thus include obtaining a probe card assembly 1412 that comprises a plurality of probes 1414 arranged so that the tips of the probes can contact corresponding terminals 1416 of the electronic devices 1418. In a second operation 1504, the probe card assembly 1414 can be positioned relative to the electronic devices 1418 to make contact between the probes 1414 makes contact with the terminals 1416.

If the probe card assembly 1412 is not sufficiently aligned relative to the electronic devices 1818, not all of the probes 1416 will make initial contact with the electronic devices 1418 at the same time. Similarly, non-planarity in the probe card assembly 1412, the electronic devices 1418, or both, may result in not all of the probes 1414 making initial contact to the terminals 1416 at the same time. Thus, as discussed earlier, over travel of the probe card assembly 1412 and electronic devices 1418 relative to each other can be used to ensure that all of the probes 1414 make reliable contact with all of the terminals 1416.

The over travel can comprise two operations. An initial over travel operation 1506 can include displacing the probe card assembly 1412 and the electronic devices 1418 by an initial over travel displacement. Over the initial over travel displacement at least one of the probes 1414 can deflect and develop an initial contact force in reaction to the displacement. The initial contact force can be substantially linearly proportional to the magnitude of the over travel displacement. For example, the initial contact force can be developed by a combination of positive stiffness of a first spring element component and positive stiffness of a second spring element component of the probes 1414.

An additional over travel operation 1508 can include increasing displacement of the probe card assembly 1412 and the electronic devices 1418 by an additional over travel displacement. Over the additional over travel displacement, the probes can further deflect, and once the initial contact force is obtained, the probes can continue to deflect and provide a sustained contact force substantially equal to the initial contact force substantially independent of the additional over travel displacement. For example, the sustained contact force can be maintained by a combination of positive stiffness of the first spring element and negative stiffness of the second spring element over the additional over travel displacement. The sustained contact force can be equal to the initial contact force within an allowable variation.

During the initial over travel operation, some probes 1414 which did not initially make contact with a terminal 1416 or that have a smaller displacement (e.g., due to misalignment or non-planarity) may not develop the full initial contact force. During the additional over travel operation, however, these probes can continue to deflect until they develop the initial contact force, and then enter their substantially zero stiffness displacement range. The probes can thus develop and maintain a force substantially equal to the initial contact force. Thus, the additional over travel can help to ensure that all of the probes make reliable contact with a minimum desired contact force (e.g., the initial contact force can be greater than a desired minimum contact force), even with misalignment and non-planarity in relative large amounts. For example, for probes having a substantially zero stiffness over a displacement range of about 40 micrometers to about 225 micrometers, an initial over travel of about 40 micrometers plus an additional over travel of about 180 micrometers can allow misalignment and non-planarity errors of up to about 180 micrometers to be accommodated. In other words, non-planarity of the probes of up to about 180 micrometers relative to each other, or alignment errors of the plane of the probes relative to the electronic device of about 180 micrometers (or combinations of both type of error totally less than about 180 micrometers) can be accommodated. The probe elements can be designed to provide substantially zero stiffness over other selected ranges, and the foregoing is just one example of many possible predefined displacement ranges over which substantially zero stiffness can be provided. For example, substantially zero stiffness can be provided over a range of about 200 to 800 micrometers, about 50 to 250 micrometers, about 20 to 100 micrometers, and about 10 to 50 micrometers. The foregoing values are examples of displacement ranges, and other displacement ranges can be used, including displacement ranges smaller or greater than the above ranges and extending above and below the above ranges. The initial and sustained contact force can be equal to 10 mN, 20 mN, 50 mN, and 100 mN. The allowable variation can be 5 mN, 10 mN, 20 mN, and 50 mN. The foregoing values are examples of initial contact force, sustained contact force, and allowable variation. Other initial contact force, sustained contact force, and allowable variation can be used, including values smaller or greater than the above.

As will now be appreciated, using probe elements as described herein, extended ranges of over travel can be provided as compared to conventional probe elements. These extended ranges of over travel can be provided while maintaining a relatively constant amount of contact force. Thus, for a given amount of applied force to the probe card assembly, a much greater over travel range can be provided (and thus larger misalignment and non-planarity errors accommodated) as compared to a probe card assembly using conventional probes.

During the initial over travel displacement, if desired, the tips of the probes can also move laterally in a direction substantially orthogonal (e.g., the x or y direction) to the direction of the initial over travel displacement (e.g., the z direction) to provide a scrubbing action.

Testing of the electronic devices can include passing test signals (which, as discussed above, can include input signals generated by the test controller 1402, and response signals generated by the electronic devices 1418 in response to the input signals) between the test controller 1402 and the electronic devices 1418 through the probe card assembly 1412. The test controller 1402 can analyze the response signals to determine whether the electronic devices 1418 pass the testing. For example, the test controller 1402 can compare the response signals to expected response signals. If the response signals match the expected response signals, the test controller 1402 can determine that the electronic devices 118 passed the testing. Otherwise, the test controller 1402 can determine that the electronic devices 118 failed the testing. As another example, the test controller 1402 can determine whether the response signals are within acceptable ranges, and if so, can determine that the DUTs 1418 passed the testing.

While probe elements described herein (e.g., probe elements 104, 200, 500, 600, 700, 800, 900, 950, 1000, 1100, 1200, 1304) have be shown used in assemblies (e.g., probe head 100 and probe card assembly 1300), probe elements can be used in other applications as well. For example, probe elements as described herein can be used for making electrical contact between components of a probe card assembly. For example, probe elements as described herein can be used to make electrical connections between a space transformer and interposer, between an interposer and other substrate, or between other components of a probe card assembly. Probe elements can also be used in other types of contactor assemblies, including for example a contactor for contacting devices in a chip carrier.

Although specific embodiments and applications of the invention have been described in this specification, these embodiments and applications are exemplary only, and many variations are possible. Accordingly, there is no intention that the invention be limited these exemplary embodiments and applications or to the manner in which the exemplary embodiments and applications operate or are described herein. For example, features shown in one embodiment can be combined with features shown in another embodiment. Probe elements illustrated herein can be made using processes different from those described, and the processes described herein can be used to make different types of probe elements than those illustrated. Accordingly, it is not intended that the invention be limited except as by the claims set forth below.

What is claimed is:

1. A microelectronic probe element for making pressure-based electrical contact to a microelectronic device for testing said microelectronic device, said microelectronic probe element comprising:
   a base;
   a tip electrically connected to said base and comprising a conductive material suitable for making pressure based electrical contact to a microelectronic device;
   a spring assembly coupled between said tip and said base, said spring assembly comprising:
      a first spring, wherein said first spring has a first spring characteristic comprising a negative stiffness over a predefined displacement range of said tip relative to said base; and
      a second spring, wherein said second spring has a second spring characteristic comprising a positive stiffness over said predefined displacement range, wherein said first spring and said second spring are coupled so that said positive stiffness substantially cancels said negative stiffness to produce a net spring characteristic of said tip relative to said base over said predefined displacement range.

2. The microelectronic probe element of claim 1, wherein said net stiffness is substantially equal to zero over said predefined displacement range.

3. The microelectronic probe element of claim 1, wherein said net spring characteristic of said tip corresponds to maintaining a substantially constant contact force of said tip over the predefined displacement range.

4. The microelectronic probe element of claim 3, wherein said substantially constant contact force is equal to a nominal contact force plus or minus a variation over the predefined displacement range, and said variation is less than about 10 mN.

5. The microelectronic probe element of claim 1, wherein said second spring operates in compression over said predefined displacement range.

6. The microelectronic probe element of claim 1, wherein said first spring is a bi-stable spring.

7. The microelectronic probe element of claim 6, wherein said first spring comprises a diaphragm shape.

8. The microelectronic probe element of claim 7, wherein said second spring is coupled to said first spring proximate a center of said diaphragm shape.

9. The microelectronic probe element of claim 1, wherein said first spring and said second spring are connected in a parallel arrangement.

10. The microelectronic probe element of claim 1, wherein said first spring and said second spring each provide positive stiffness between a zero displacement and an initial displacement such that said net spring characteristic of said tip relative to said base provides positive stiffness between said zero displacement and said initial displacement.

11. The microelectronic probe element of claim 1, wherein said tip is disposed off centered relative to one of said first spring and said second spring to produce a movement of said tip during displacement of said tip relative to said base, and said movement is in a different direction than said displacement.

12. The microelectronic probe element of claim 1, wherein one of said first spring and said second spring is asymmetrically shaped to produce a movement of said tip during displacement of said tip relative to said base, and said movement is in a different direction than said displacement.

13. The microelectronic probe element of claim 1, wherein one of said first spring and said second spring is supported by said base on a plurality of post portions of said base.

14. A probe card assembly comprising:
a rigid substrate;
an electrical interface coupled to said substrate;
a plurality of probes coupled to said substrate and arranged to contact terminals of a microelectronic device, wherein said substrate comprises electrical connections between said probes and said electrical interface, wherein ones of said probes comprise a first spring element and a second spring element coupled together; and
wherein said first spring element and second spring element comprise spring characteristics that are complementary to each other over a predefined displacement range so that over said predefined displacement range said ones of said probes provide a contact force having a substantially constant magnitude,
wherein said ones of said probes provides a substantially zero stiffness over said predefined displacement range, and wherein over an initial displacement range less than said predefined displacement range said ones of said probes provide a positive stiffness.

15. The probe card assembly of claim 14, wherein said substantially constant contact force is equal to a nominal contact force within an allowed variation.

16. The probe card assembly of claim 15, wherein said allowed variation is less than 10 millinewtons.

17. The probe card assembly of claim 14, further comprising a plurality of probe substrates coupled to said rigid substrate, wherein said plurality of probes are disposed on said plurality of probe substrates.

18. The probe card assembly of claim 14, wherein said ones of said probes comprises means for producing wiping movement of a tip of said probe in response to said initial displacement.

19. A probe card assembly comprising:
a rigid substrate;
an electrical interface coupled to said substrate;
a plurality of probes coupled to said substrate and arranged to contact terminals of a microelectronic device, wherein said substrate comprises electrical connections between said probes and said electrical interface, wherein ones of said probes comprise a first spring element and a second spring element coupled together; and
wherein said first spring element and second spring element comprise spring characteristics that are complementary to each other over a predefined displacement range so that over said predefined displacement range said ones of said probes provide a contact force having a substantially constant magnitude,
wherein:
said first spring element comprises a bi-stable spring; and
said second spring element comprises a linear spring connected to said first spring in a parallel arrangement.

20. A process of using a probe card assembly comprising:
obtaining a probe card assembly comprising a plurality of probes coupled to a substrate and each comprising a tip, said plurality of probes arranged so said tips can contact corresponding terminals of a microelectronic device, and each of said probes comprising a first spring element and a second spring element;
positioning said probe card assembly and said microelectronic device together to make contact between said probes and said terminals;
displacing said probe card assembly and said microelectronic device together by an initial over travel displacement, wherein ones of said plurality of probes deflects and develops an initial contact force in reaction to said initial over travel displacement, said initial contact force being substantially linearly proportional to said initial over travel displacement, and said initial contact force obtained by a combination of positive stiffness of said first spring element and positive stiffness of said second spring element over said initial over travel displacement; and
increasing displacement of said probe card assembly relative to said microelectronic device by an additional over travel displacement, wherein said ones of said plurality of probes further deflects and provides a sustained contact force substantially equal to said initial contact force substantially independent of said additional over travel displacement, said sustained contact force being maintained by a combination of positive stiffness of said first spring element and negative stiffness of said second spring element over said additional over travel displacement.

21. The process of claim 20, wherein, said increasing displacement of said probe card assembly comprises said plurality of probes each deflecting and providing a sustained contact force substantially equal to said initial contact force.

22. The process of claim 20, wherein said tip of said one of said plurality of probes moves laterally in a direction substantially orthogonal to a direction of said initial over travel displacement during said displacing said probe card assembly and said microelectronic device together by said initial over travel displacement.

23. The process of claim 20, further comprising applying signals through ones of said plurality of probes to said terminals to test said microelectronic device.

* * * * *